United States Patent [19]
Levine

[11] 4,066,981
[45] Jan. 3, 1978

[54] EMP RESISTANT OSCILLATOR WITH FIBER OPTIC FREQUENCY DETERMINING MEANS

[75] Inventor: Arnold M. Levine, Chatsworth, Calif.

[73] Assignee: International Telephone and Telegraph Corporation, New York, N.Y.

[21] Appl. No.: 746,797

[22] Filed: Dec. 2, 1976

[51] Int. Cl.² .............................................. H03B 5/02
[52] U.S. Cl. ................................ 331/108 B; 330/109; 330/293; 330/302; 331/135; 331/179; 333/29; 333/70 R
[58] Field of Search ............... 331/108 R, 108 B, 135, 331/179; 330/28, 31, 109; 333/29, 70 R; 350/96 R, 96 B, 96 BC, 96 C, 96 WG; 250/199

[56] References Cited

U.S. PATENT DOCUMENTS

| 3,717,769 | 2/1973 | Hubbard et al. | 250/199 |
| 3,943,358 | 3/1976 | Reymond et al. | 250/199 |
| 3,962,652 | 6/1976 | Zarin et al. | 331/107 A X |

*Primary Examiner*—Siegfried H. Grimm
*Attorney, Agent, or Firm*—William T. O'Neil

[57] ABSTRACT

A fiber optic delay line-controlled oscillator or tuned amplifier. Two embodiments are shown and described, one employing a single solid state active element and the other employing two such elements. The fiber optic delay line or lines employed are combined electronic-to-light transducer(s) supplying the delay line or lines and optical-to-electronic transducer(s) responsive to the optical delay line or lines output(s). That combination provides the tuned or oscillatory feedback path. In one embodiment, a plurality of delay lines are effectively switched into the circuit discretely and selectively in response to a staircase control function.

8 Claims, 4 Drawing Figures

EMP RESISTANT OSCILLATOR WITH FIBER OPTIC FREQUENCY DETERMINING MEANS

BACKGROUND OF THE INVENTION

The invention relates generally to electronic frequency generation.

DESCRIPTION OF THE PRIOR ART

In the prior art, oscillators have been known in many forms. The frequency stability of an oscillator has been the subject of intense development since the earliest days of electronics. The ordinary inductance and capacitance resonant circuit as a frequency setting element, i.e., as a positive feedback filter, has well known limitations in respect to stability of frequency. The introduction of piezoelectric elements in lump form (crystals) for frequency determination provided important improvements respecting oscillator stability, and still later, such devices as the so-called SAW (surface acoustic wave) device have contributed to the progress of oscillator stabilizing technology.

Delay lines, which in a broad sense are filters, have also been applied as frequency determining elements in oscillators. In a very broader sense, it may of course be said that the familiar LC tank circuit, RC circuits for producing phase shift, delay lines, and even piezoelectric (lumped and distributed) frequency determining elements may be broadly classified as filters of one type or another. According to oscillator theory, an amplifier circuit may be made to oscillate if a feedback path providing 180° phase shift is employed and the gain of the loop is just sufficient to overcome the losses plus a minimal margin. Also according to oscillator theory, the higher the Q (the narrower the pass band of the frequency determining filter), the more stable the oscillator will be, everything else being equal.

Piezoelectric crystals, such as the familiar quartz crystal, are known to exhibit very high Qs, a fact consistent with the high order of frequency stability provided by oscillating piezoelectric quartz. Considering the use of a delay line as a frequency determining element, it should be pointed out that a delay line is, broadly speaking, a specialized filter, and the manner in which the combination of the present invention is constructed to provide even higher effective or equivalent Q factors with resulting even higher orders of frequency stability will be evident as this description proceeds.

SUMMARY

According to the present invention, the positive feedback path (frequency determining network) of an oscillator is provided by a fiber optic filter or delay line element with an input electric-to-optical transducer and output optical-to-electric transducer.

It is known that optical fibers are capable of data transmission bandwidths very much higher than provided by prior art filter arrangements. This translates to a very linear phase shift versus frequency curve. Stated otherwise, pulse or continuous waveforms are repeated therethrough with extraordinary fidelity. The technical paper, "Fiber-Optic Delay Lines for Microwave Signal Processing", published in the proceedings of the IEEE, Volume 64, No. 5, May 1976 (Kalman Wilner and Anthony P. Van Den Heuvel, authors) in addition to being a useful reference relating to fiber optic delay lines as used in the present combination, also conveys corroborating information as to bandwidths and propagation attenuation as a function of frequency. The effect of employing the fiber optic filter (delay line) as a frequency determining element in an oscillator according to the combination of the invention is to very significantly increase the effective or equivalent Q of the frequency determining circuit, even as compared to the best piezoelectric elements. Moreover, the immunity of fiber optic elements to electromagnetic pulse interference and to various mechanical and environmental factors, which are known to deteriorate the performance of prior art oscillators, affords a very significant advantage to the invention.

The details of the manner in which an oscillator may be implemented according to the invention will be evident as this description proceeds.

DESCRIPTION OF PREFERRED EMBODIMENT

Figure 1:
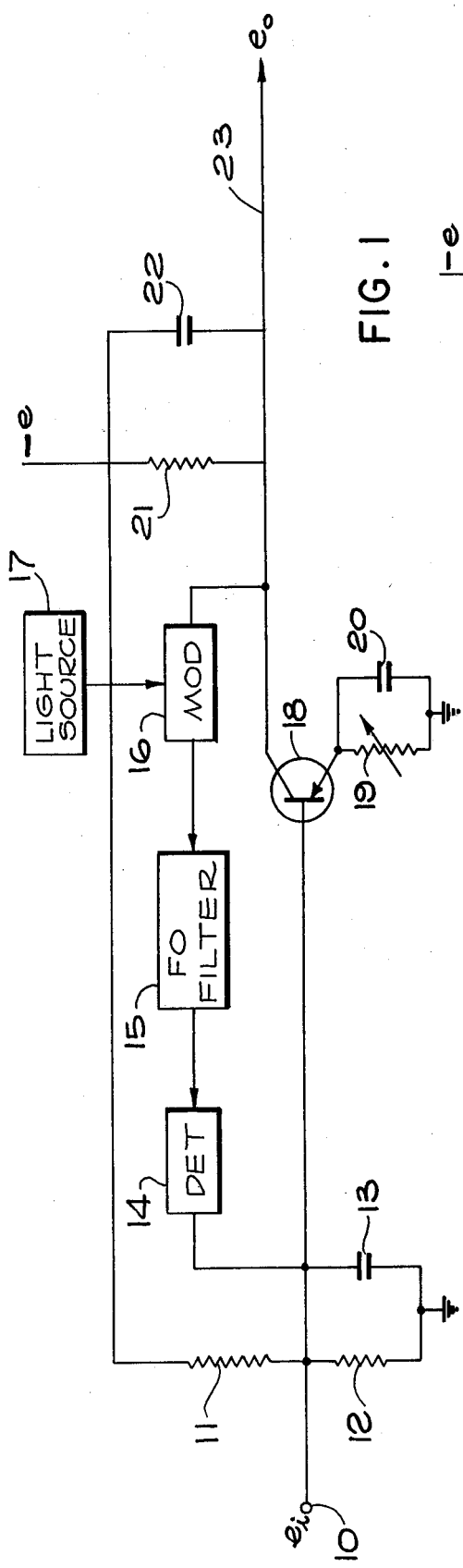
FIG. 1 is a single active element oscillator configuration employing a fiber optic filter frequency determining element.

Referring now to FIG. 1, a circuit involving a single active element in the form of transistor 18 is depicted. For the description of the circuit as an oscillator, the input terminal 10 is ignored, and it is assumed that the input signal $e_i$ is not present. As will be recognized by those skilled in this art, a collector load resistance 21 supplied from a dc source e develops an output signal amplified with respect to that present at the base electrode, i.e. at the junction of the resistances 11 and 12. A feedback path comprising capacitor 22, resistors 11 and 12 and capacitor 13 affords a stabilizing negative feedback which is of itself sufficient to reduce the overall gain between the points 10 and 23 to a value below unity. This is accomplished by selection of the values of resistances 11 and 12. Capacitor 22 would be a relatively large value and can be selected according to known criteria such that the negative feedback provided through that path provides effective negative feedback even at relatively low frequencies. Capacitance 13 may or may not be necessary but is shown for suppression of higher frequencies and noise at the base of transistor 18. Thus its value would be relatively small in any event. Similarly, capacitor 20, across the variable bias resistor 19, is not necessarily required but its inclusion tends to limit the amount of inverse feedback applied by the potential developed across 19 at all but the relatively low frequencies. The value of 19 can therefore be adjusted to make a gain adjustment without significantly changing the amount of negative feedback extant.

Referring now to the feedback path comprising 16, 15 and 14, it will be immediately obvious that this path also provides negative feedback, except at and near the frequency corresponding to the delay time of fiber optic filter 15. The electro-optical modulator 16 may be any of the various types known and understood in this art and functions to impress the electrical signal extant on 23 as a modulation onto a light carrier provided by source 17. The fiber optic filter 15 is a length of optical fiber which introduces a delay preselected for the desired effect as further described hereinafter. Detector 14, such as a photodiode, returns the signal at its output to the electric domain. Thus, the series including 16, 15 and 14 has an electric input and electric output notwithstanding the use of the light carrier from 17.

If it is assumed that the circuit of FIG. 1 is to be operated as an oscillator, the delay time selected for 15 will provide positive feedback at a discrete frequency corresponding to that frequency at which the delay time constitutes 180° phase shift. It is known in oscillator technology that a high Q frequency determining network is consistent with a high order of oscillator stability. All frequency determining networks or "tank circuits" used in oscillators may be thought of as filters in a general sense. As commonly employed in oscillator circuits, such filters have transmission characteristics which are peaked at or near the frequency of oscillation. The higher the Q of the filter, the sharper this peak will be and the more stable will be the operation of the oscillator, particularly if the gain at the frequency of oscillation about the positive feedback loop is only a small amount in excess of unity. Stated otherwise, if the skirts of the filter are steep, only a small deviation from the intended frequency of oscillation reduces the gain of the total feedback loop below the value which will sustain oscillation. The fiber optic filter as employed in the combination of the present invention is the basic frequency determining filter, and in addition to possessing a very high order of transfer time stability (phase delay), its very high pass bandwidth characteristic translates to the equivalent of a very high filter circuit Q value. Accordingly, an oscillator constructed as described using the fiber optic filter as a frequency determining element is an extremely stable device having a high order of immunity to the commonly encountered environmental and other factors which adversely affect the stability of most prior art oscillators.

The modulator 16 and detector 14 serve as electric-to-light and light-to-electric transducers respectively.

The circuit of FIG. 1 is also readily adapted to operation as a peaking amplifier if the circuit gain is reduced just below the value required to sustain oscillation. In that event, a signal $e_i$ applied at the input terminal 10 is sharply peaked at the output 23.

Figure 2:
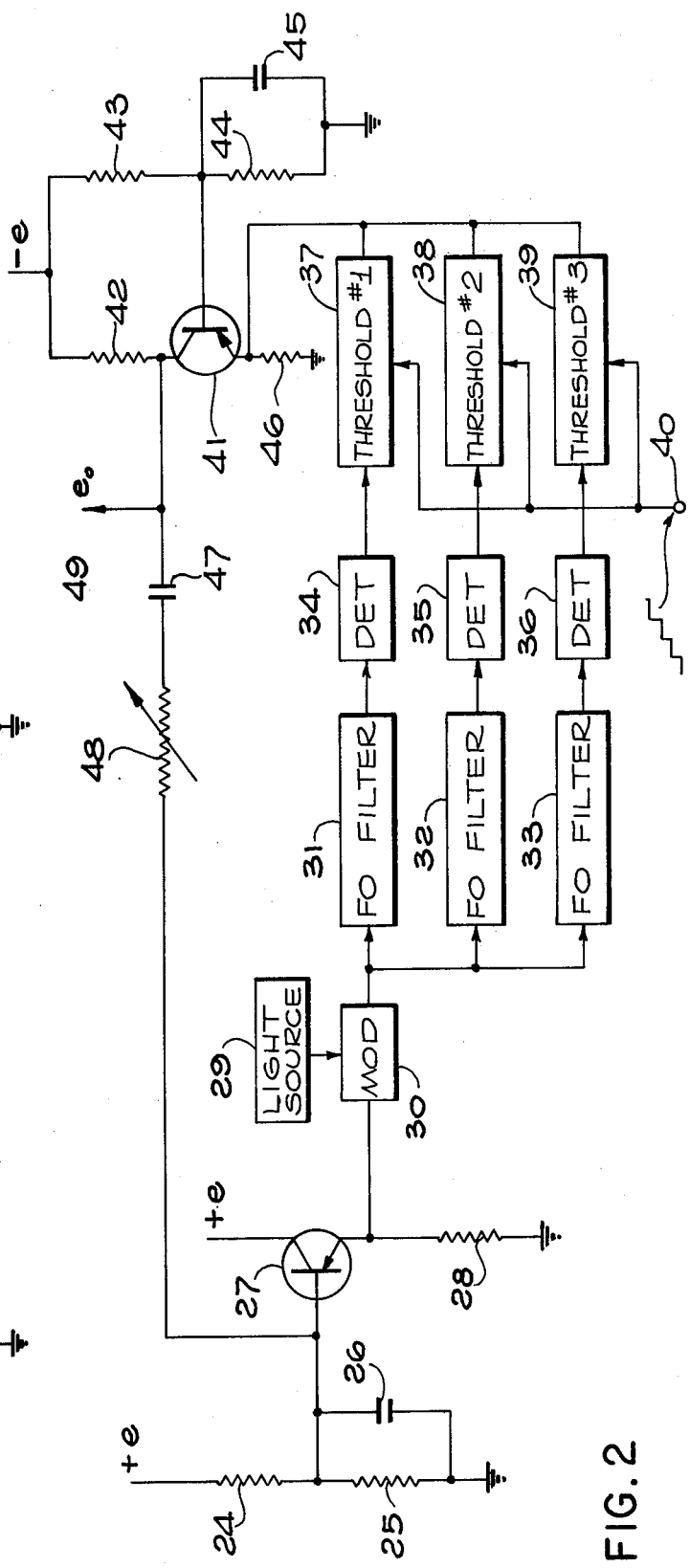
FIG. 2 is a configuration of oscillator employing two active solid state elements and a plurality of selectively employed fiber optic frequency determining elements for providing a programmed sequence of frequencies.

Referring now to FIG. 2, a multiple (selectable) frequency oscillator employing the concepts of the invention is shown. The arrangement of FIG. 2 includes a gain device or element in the form of transistor 27 and also an additional gain producing element in the form of transistor 41. The gain stage including transistor 41 has its operating point partially determined and its gain stabilized to some extent through the degeneration afforded by the resistor 46. Otherwise resistors 43 and 44 acting as a divider provide a direct base bias for 41 in a manner well understood in accordance with transistor circuit theory. Capacitor 45 acts to prevent transients or noise from influencing the circuit by stabilizing the instantaneous base potential and current of 41. The input to the gain stage including 41 is introduced across resistor 46 and is the output of one of the threshold circuits 37, 38 or 39. The details of the operation of these circuits will be more fully set forth as this description proceeds. The threshold circuit No. 1, namely element 37, receives the signal through fiber optic filter 31 via detector 34. Similarly, threshold circuit 38 receives the signal through 32 via 35, as does 39 receive the signal output of 33 through detector 36. The fiber optic filters 31, 32 and 33 are driven in parallel from modulator 30, which may be any of the known types of optical modulators. The light source 29 provides a light carrier as was the case with element 17 in FIG. 1. In FIG. 1, the signal developed across resistance 21 modulated the light source, and in FIG. 2 a similar situation exists in that the signal across resistance 28 is applied to modulator 30 which impresses itself as a modulation on the light carrier from 29.

Although the circuit of FIG. 2 is depicted essentially as an oscillator, a signal input (corresponding to 10 in FIG. 1) could be applied to the junction of resistances 24 and 25 if it were desired to operate the circuit as a peaking amplifier. In that case, the gain of the feedback path which includes the blocking capacitor 47 and variable resistor 48 would be adjusted so that free-running oscillation did not take place. This feedback path, like the path comprising capacitor 22 and resistance 11 in FIG. 1, is basically degenerative, the positive feedback being applied through a selected one of the filter/detector/threshold circuit paths, for example through 31 and 34 and 37.

The source stabilization for transistors 27 and 41 is effected through the divider actions of resistances 24 and 25 and bypass capacitor 26, and resistances 43 and 44 with bypass capacitor 45, respectively. The functional and design criteria, therefor, are the same as applicable to resistances 11 and 12 and capacitor 13 in FIG. 1.

Figure 3:
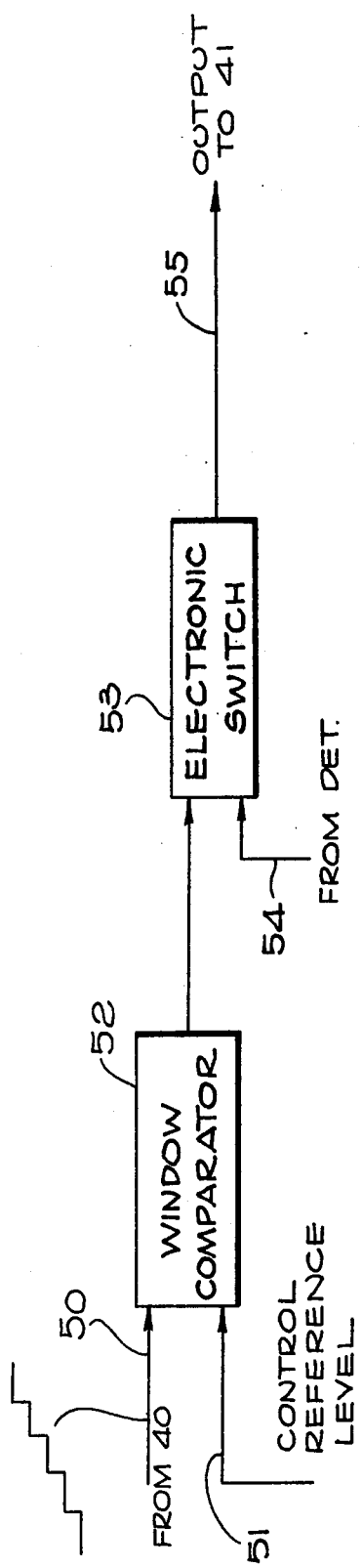
FIG. 3 is a detail of the threshold circuits of FIG. 2.

The circuit of FIG. 2 being basically a programmed frequency device or synthesizer, provides for a ramp or staircase control signal applied at terminal 40 to all of the threshold circuits such as 37, 38 and 39 in parallel. These threshold circuits respond discretely and successively to a particular predetermined level of the ramp or staircase voltage. For a more complete understanding of the nature of the threshold circuits, reference is made to FIG. 3. In that figure a window comparator 52 is shown receiving the ramp or staircase voltage on its input 50 from the parallel control input terminal 40 of FIG. 2. Terminal 51 receives a discrete bias or predetermined comparison level corresponding to a particular desired frequency of oscillation of the device in FIG. 2. The so-called window comparator in general form is known and is described in the technical literature. For example, see the text, "Electronic Analog and Hybrid Computers", by Korn and Korn, 2nd Edition, published by McGraw Hill Book Company.

By design, the level on lead 51 for each threshold circuit is between the levels of a different adjacent pair of plateaus on the control staircase waveform at 40. Accordingly, circuit 52 produces an output gate at the corresponding time and applies this gate to an electronic switch 53. The operation of 53 is basically to connect its input lead 54 to its output lead 55 during the time of gating by 52. Each of the threshold circuits 37, 38 and 39 is understood to include the typical arrangement of FIG. 3.

The circuit of FIG. 2, is to be understood to be adapted to the employment of as many of the fiber optic filter, detector and threshold circuit frequency determining arrangements as desired, although only three are actually illustrated. The duplication of circuitry required is evident, once the device is understood as illustrated.

Figure 4:
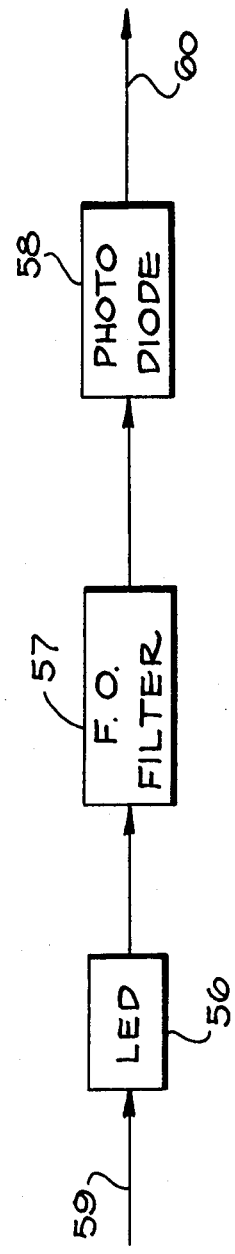
FIG. 4 is an alternative input and output transducer arrangement usable in combination with the fiber optic frequency determining element.

Although the light source and modulator, such as 17 and 16 in FIG. 1 and 29 and 30 in FIG. 2, has been illustrated and described, among the variations possible in these circuits is the use of an LED device in lieu thereof. Referring to FIG. 4, this alternative arrangement is depicted. In the case of FIG. 1, the substitution of FIG. 4 combination would eliminate 16 and 17, and the input to 16 would instead be supplied to terminal 59 of the LED 56. Fiber optic filter 57 is then that of element 15 in FIG. 1, and the photodiode 58 is the detector 14, also of FIG. 1. Output 60 then becomes the output of 14 connected to the base of transistor 18.

In FIG. 2, the same substitution may be made, eliminating 29 and 30. Of course, a separate LED 56 is required for each of the frequency determining combinations in FIG. 2.

Among the additional variations and modifications of the combination described would be location of the threshold circuits ahead of the detectors or, even ahead of the LED input elements, in the arrangement of FIG. 2. Moreover, the fiber optic delay line selection mechanism of FIG. 2 can obviously be employed in the general circuit layout of FIG. 1.

Other modifications and variations will suggest themselves to those skilled in this art and, accordingly, it is not intended that the drawings of this description should be considered as limiting the scope of the invention. The drawings in this description are to be considered as typical and illustrative only.

What is claimed is:

1. An oscillatory circuit comprising:
   at least one gain producing element having an input and an output;
   at least one feedback path connected between said input and said output of said gain producing element;
   and frequency determining means within said feedback path comprising, at least one electric-to-optical transducer responsive to said output of said gain producing element, at least one fiber optic filter responsive to light signals from said transducer, and an optical-to-electric transducer responsive to said fiber optic filter, said fiber optic filter providing a phase shift within said feedback such as to produce positive feedback.

2. Apparatus according to claim 1 in which said fiber optic filter is defined as providing substantially 180° of electrical delay at the frequency of oscillation.

3. Apparatus according to claim 1 including a source of light carrier signal and in which said electric-to-optical transducer is an optical modulator for modulating said light carrier in accordance with the output signal of said gain producing element.

4. Apparatus according to claim 1 in which said electric-to-optical transducer is a light emitting diode and said optical-to-electric transducer is a photo diode.

5. Apparatus according to claim 3 in which said frequency determining means include a plurality of said fiber optic filters and a corresponding plurality of said optical-to-electric transducers, said fiber optic filters having differing phase delays and each having an input and an output, said inputs being responsive in parallel to said optical modulator, each of said optical-to-electric transducers being responsive to a corresponding optical filter and having a corresponding threshold circuit at its output, all of said threshold circuits responding to a variable level external control signal to enable a discrete one of said threshold circuits at any one time for connecting the corresponding optical filter and optical-to-electric transducer to said gain producing element input, thereby to determine the operating frequency of said oscillator in discrete steps as a function of said external control signal.

6. Apparatus according to claim 4 in which said frequency determining means include a plurality of said fiber optic filters and a corresponding plurality of said optical-to-electric transducers, said fiber optic filters having differing phase delays and each having an input and an output, said inputs being responsive in parallel to said light emitting diode, each of said optical-to-electric transducers being responsive to a corresponding optical filter and having a corresponding threshold circuit at its output, all of said threshold circuits responding to a variable level external control signal to enable a discrete one of said threshold circuits at any one time for connecting the corresponding optical filter and optical-to-electric transducer to said gain producing element input, thereby to determine the operating frequency of said oscillator in discrete steps as a function of said external control signal.

7. Apparatus according to claim 5 in which said threshold circuits each comprise a window comparator responsive to said external control signal and to a discrete corresponding, predetermined control reference level for generating a gating function whenever the amplitude of said control signal equals said corresponding reference level within a predetermined tolerance, and including an electronic switch arranged to discretely connect the output of the corresponding optical-to-electric transducer to the input of said gain producing element.

8. Apparatus according to claim 6 in which said threshold circuits each comprise a window comparator responsive to said external control signal and to a discrete corresponding, predetermined control reference level for generating a gating function whenever the amplitude of said control signal equals said corresponding reference level within a predetermined tolerance, and including an electronic switch arranged to discretely connect the output of the corresponding optical-to-electric transducer to the input of said gain producing element.

* * * * *